United States Patent
Johnson et al.

(10) Patent No.: US 11,375,318 B1
(45) Date of Patent: Jun. 28, 2022

(54) MEMS DEVICE INCLUDING A SUPPORT STRUCTURE

(71) Applicant: Knowles Electronics, LLC, Itasca, IL (US)

(72) Inventors: Jeremy Johnson, Glen Ellyn, IL (US); Yenhao Chen, San Jose, CA (US)

(73) Assignee: Knowles Electronics, LLC, Itasca, IL (US)

( * ) Notice: Subject to any disclaimer, the term of this patent is extended or adjusted under 35 U.S.C. 154(b) by 0 days.

(21) Appl. No.: 17/127,993

(22) Filed: Dec. 18, 2020

(51) Int. Cl.
   *H04R 19/00* (2006.01)
   *H04R 19/04* (2006.01)
   *B81B 3/00* (2006.01)

(52) U.S. Cl.
   CPC .......... *H04R 19/005* (2013.01); *B81B 3/0021* (2013.01); *H04R 19/04* (2013.01); *B81B 2201/0257* (2013.01); *B81B 2203/0127* (2013.01); *H04R 2201/003* (2013.01)

(58) Field of Classification Search
   CPC ............... H04R 19/005; H04R 19/04; H04R 2201/003; B81B 3/0021; B81B 2201/0257; B81B 2203/0127
   See application file for complete search history.

(56) References Cited

U.S. PATENT DOCUMENTS

| 9,462,389 | B2 | 10/2016 | Wang |
| 9,820,058 | B2 | 11/2017 | Pan |
| 10,129,651 | B2 | 11/2018 | Zhang |
| 10,158,949 | B2 | 12/2018 | Sun |
| 10,544,038 | B2 | 1/2020 | Park |
| 2014/0133686 | A1 | 5/2014 | Lee |
| 2017/0230757 | A1 | 8/2017 | Kuntzman et al. |
| 2018/0146302 | A1* | 5/2018 | Chen ................... B81C 1/00309 |
| 2018/0262845 | A1* | 9/2018 | Shi .......................... B81B 3/007 |

FOREIGN PATENT DOCUMENTS

| CN | 201898600 U | 7/2011 |
| CN | 206821014 U | 12/2017 |

OTHER PUBLICATIONS

Ko, "Micromachined air-gap structure MEMS acoustic sensor using reproducible high-speed lateral etching and CMP process", Institute of Physics Publishing, Journal of Micromechanics and Microengineering, Aug. 29, 2006.

* cited by examiner

*Primary Examiner* — Matthew A Eason
(74) *Attorney, Agent, or Firm* — Loppnow & Chapa; Matthew C. Loppnow

(57) ABSTRACT

A MEMS can include a substrate including a first side and a second side on an opposite side of the substrate from the first side. The MEMS device can include an aperture running through the substrate from the first side to the second side. The substrate can have an edge surrounding the aperture on the first side. The MEMS device can include a diaphragm located over the aperture on the first side. The MEMS device can include a support structure that extends at least partially across the aperture from the edge.

20 Claims, 6 Drawing Sheets

MEMS DEVICE INCLUDING A SUPPORT STRUCTURE

BACKGROUND

1. Field

The present disclosure is directed to a microelectromechanical systems (MEMS) device including a support structure.

2. Introduction

Presently, electronic devices like mobile phones, personal computers, smart speakers, hearing aids, true wireless earphones, and other electronic devices commonly incorporate one or more small microphones, sensors, and/or actuators. Advancements in micro and nanofabrication technologies have led to the development of MEMS devices, such as microphones, sensors, and actuators, having progressively smaller size and different form-factors.

Certain MEMS devices include a diaphragm that is used to sense sound or vibration, used to generate sound or vibration, and/or used for other purposes. Unfortunately, the diaphragm can receive damage and fracture in response to an airburst event, a drop event, a mechanical shock, and/or any other event that causes the diaphragm to bend or deform. For example, during an airburst or drop event, the diaphragm is pressed against a backplate and associated features in one direction and supported by the perimeter of an acoustic port in the other direction. With a large enough pressure stimulus, the diaphragm can break once the diaphragm reaches a critical bending angle.

BRIEF DESCRIPTION OF THE DRAWINGS

In order to describe the manner in which advantages and features of the disclosure can be obtained, a description of the disclosure is rendered by reference to specific embodiments thereof which are illustrated in the appended drawings. These drawings depict only example embodiments of the disclosure and are not therefore considered to limit its scope. The drawings may have been simplified for clarity and are not necessarily drawn to scale.

DETAILED DESCRIPTION

Embodiments provide a MEMS device including a support structure. According to an embodiment, the MEMS device can include a substrate including a first side and a second side on an opposite side of the substrate from the first side. The MEMS device can include an aperture running through the substrate from the first side to the second side. The substrate can have an edge surrounding the aperture on the first side. The MEMS device can include a diaphragm located over the aperture on the first side. The MEMS device can include a support structure that extends at least partially across the aperture from the edge.

Figure 1:
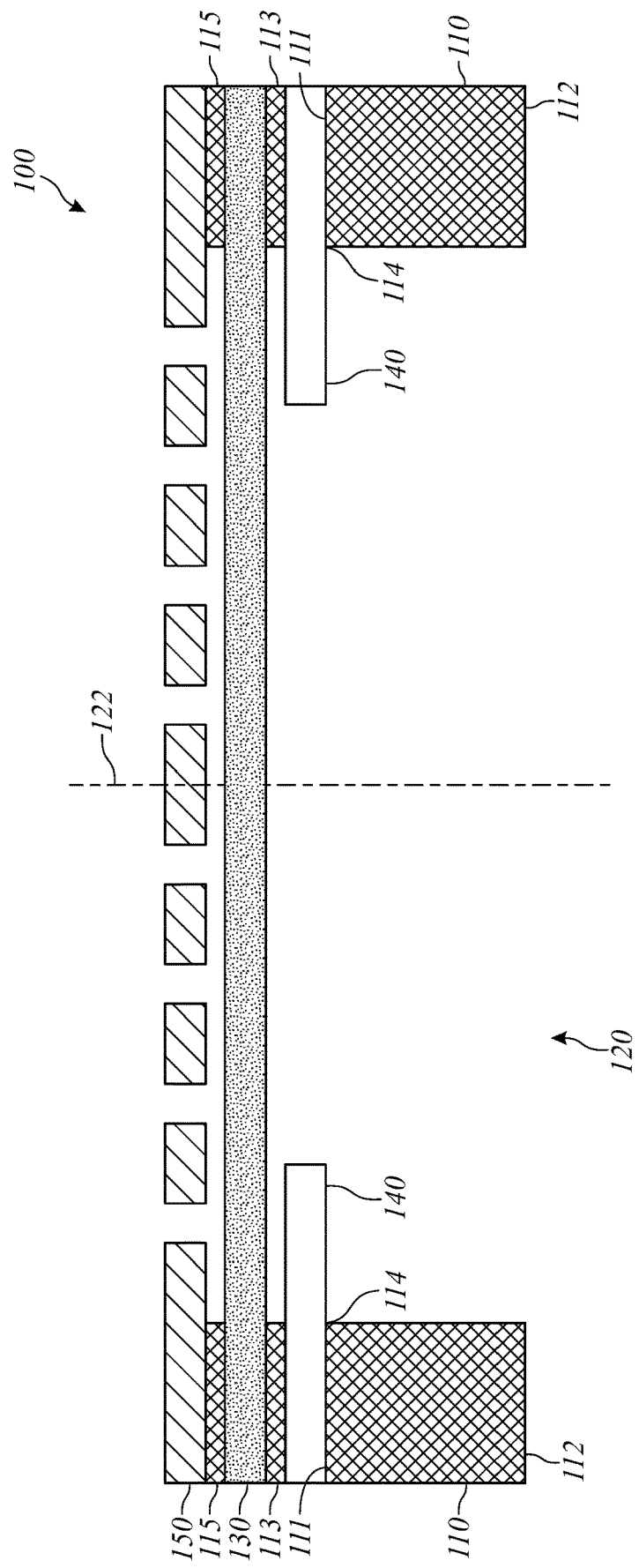
FIG. 1 is a cross-sectional view of a MEMS device according to an embodiment.

Turning to FIG. 1, a MEMS device 100 can include a substrate 110 including a first side 111 and a second side 112 on an opposite side of the substrate 110 from the first side 111. The MEMS device 100 can include an aperture 120 running through the substrate 110 from the first side 111 to the second side 112. The substrate 110 can have an edge 114 surrounding the aperture 120 on the first side 111. The MEMS device 100 can include a diaphragm 130 located over the aperture 120 and over the first side 111.

The MEMS device 100 can include a support structure 140 that extends at least partially across the aperture 120 from the edge 114. The support structure 140 can extend only partway across the aperture 120, can bridge all the way across the aperture 120, or can extend any other way at least partially across the aperture 120 from the edge 114 of the substrate 110. The support structure 140 can be part of the substrate 110 or can be a separate structure from the substrate 110. The support structure 140 can be located between the diaphragm 130 and the aperture 120. In some embodiments, the support structure 140 is sandwiched between a first spacer 113 and the substrate 110, but even in these embodiments the support structure 140 may still be considered between the diaphragm 130 and the aperture 120 in the substrate 110 below the support structure 140. In other embodiments, the support structure 140 and the substrate 110 are made of a single piece of material. The support structure 140 can be, in any dimension, rectangular, trapezoidal, triangular, curved, or any other shape that extends from the edge 114 at least partially across the aperture 120.

Movement of the diaphragm 130 typically involves the diaphragm 130 flexing in a direction parallel to a longitudinal axis of the aperture 120 from the first side 111 to the second side 112. Movement of the diaphragm 130 can cause contact between the diaphragm 130 and the support structure 140. For example, movement of part or all of the diaphragm 130 in response to mechanical stimulus larger than typical sensing operation can cause contact between the diaphragm 130 and the support structure 140, which allows the diaphragm 130 to survive the large mechanical stimulus in cases where it can otherwise receive damage without the support structure 140. For example, the support structure 140 may reduce flexing of the diaphragm 130 in the direction of the aperture 120 to survive the stimulus. After survival, the diaphragm 130 may return to its previous resting state. To elaborate, the support structure 140 can absorb shock of, reduce motion of, stop motion of, or otherwise affect the diaphragm 130 when the diaphragm 130 deforms in response to an airburst event, a drop event, a mechanical load, and/or any other event. The support structure 140 may also act to stiffen the whole MEMS device 100, such as by providing structural support for elements of the MEMS device 100.

According to an embodiment, the MEMS device 100 can include a back plate 150 located on an opposite side of the diaphragm 130 from the support structure 140. For example, the support structure 140 can be located under the diaphragm 130 on an opposite side of the diaphragm 130 from the back plate 150. In some embodiments, the diaphragm 130 is sandwiched between a second spacer 115 and the back plate 150.

The diaphragm 130 can be substantially flat. Alternately, the diaphragm 130 can be convex, with an area of the diaphragm 130 near a center axis 122 of the aperture 120 being farther away from the support structure 140 in a direction parallel with the center axis 122 than an area near the edge 114 so that, during extreme motion along the center axis 122, the diaphragm 130 may not necessarily touch the support structure 140 even if the support structure 140 extends all the way across the aperture 120.

There are many possible configurations for the support structure 140. For example, the support structure 140 can extend from the substrate edge 114 in a direction radially across the aperture 120 from the substrate edge 114 to the center axis 122 or off-radially, but still in a direction generally towards the center axis 122. For example, the support structure 140 can be a beam or other structure that points directly at the center axis 122 within or above the aperture 120 in a direction radial to the edge 114 or that points at an angle between a radial direction from, and a tangential direction to, the edge 114.

Figure 2A:
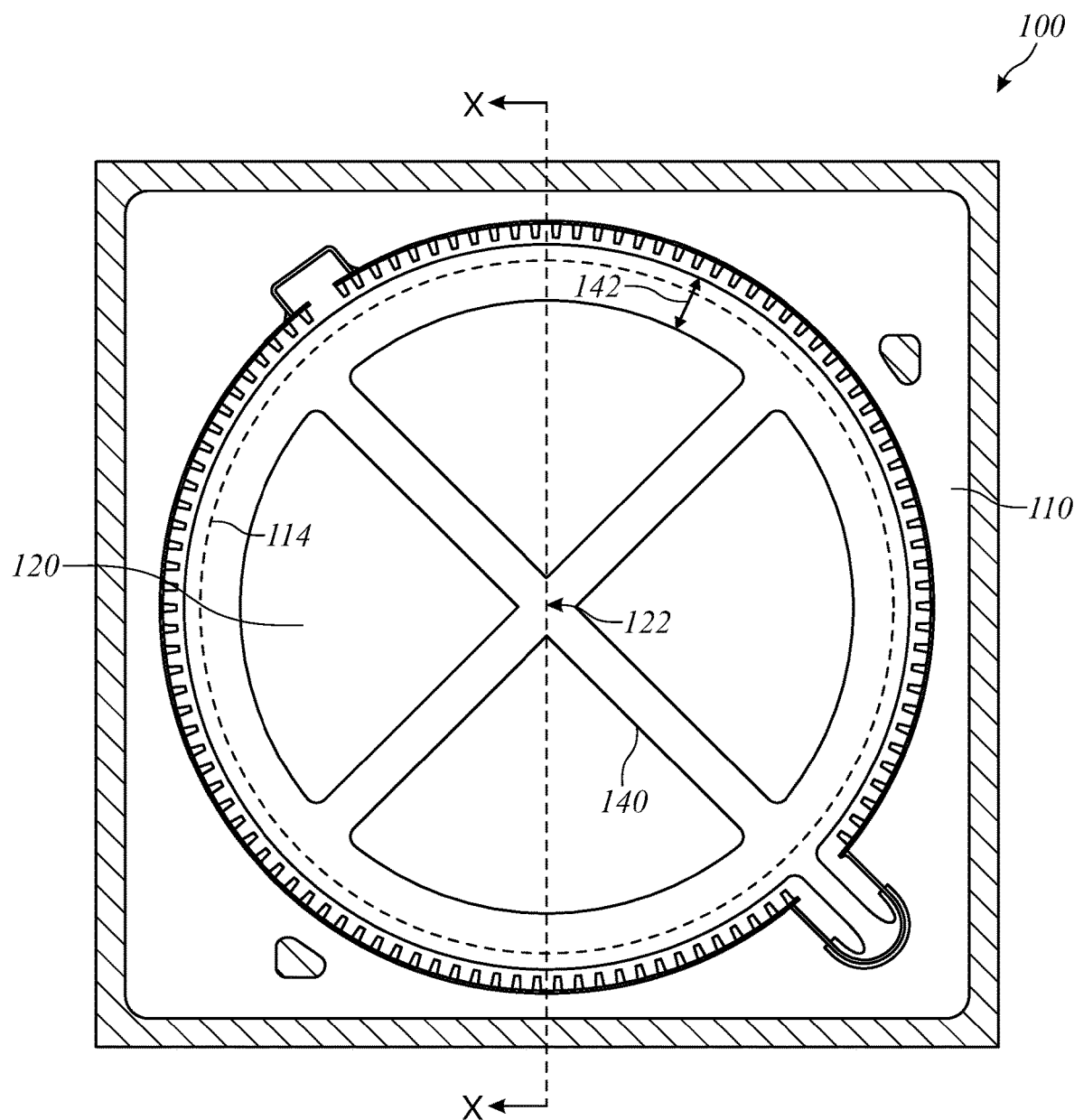
FIG. 2A is top plan view of a MEMS device according to an embodiment.
Figure 2B:
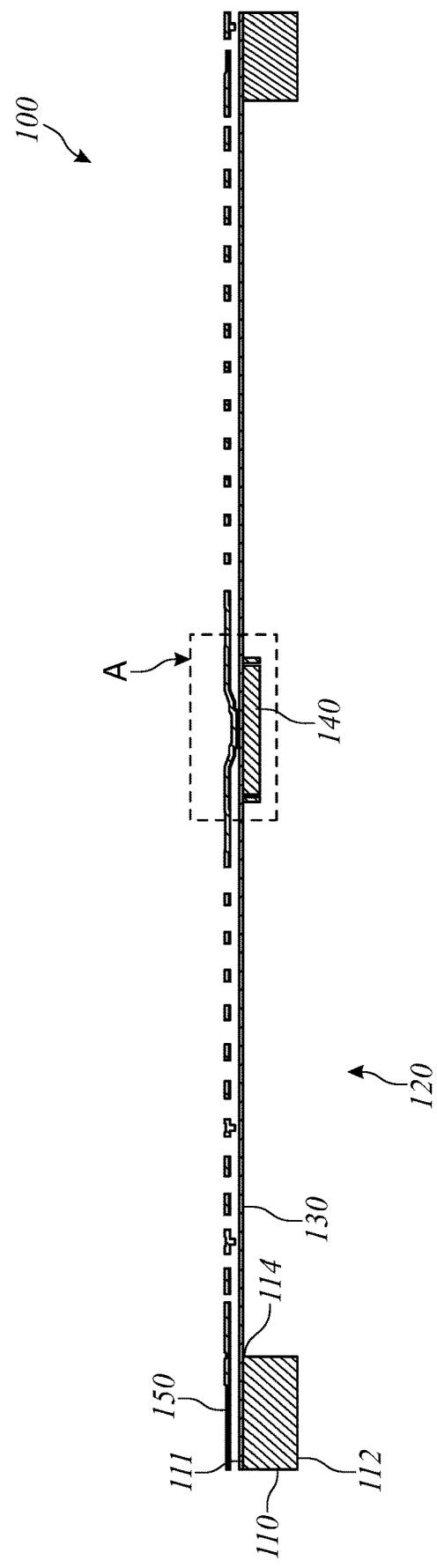
FIG. 2B is a side cross-section view of the MEMS device of FIG. 2A taken along the line X-X in FIG. 2A, according to an embodiment.
Figure 2C:
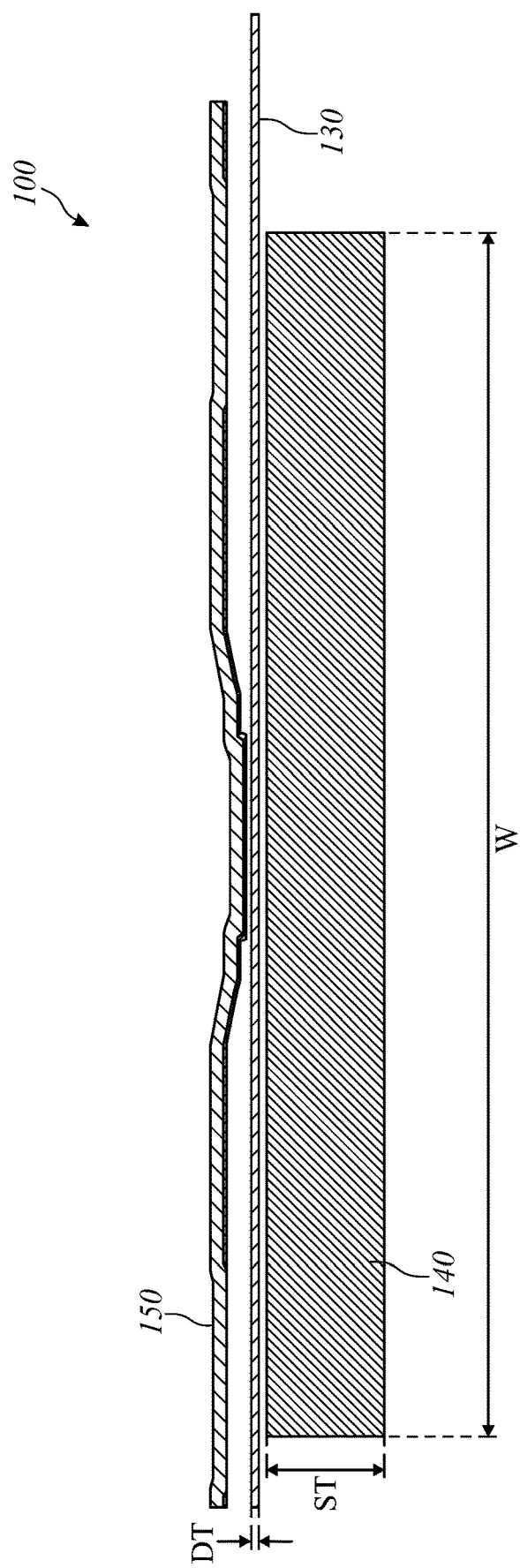
FIG. 2C is an enlarged view of a portion of the MEMS device of FIG. 2B, indicated by the arrow A in FIG. 2B, according to an embodiment.

Turning to FIGS. 2A-2C, in an embodiment, the MEMS device 100 includes a shelf 142 that extends along the edge 114. The support structure 140 can extend from the shelf 142. The shelf 142 can be part of the support structure 140 or can be a separate structure from the support structure 142. According to an embodiment, the shelf 142 is the same shape as the aperture 120. For example, if the aperture 120 is circular the shelf 142 may be an annulus. The shelf 120 may also take any other useful shape, such as a shape that does not match the shape of the aperture 120.

For example, according to an embodiment, the support structure 140 is coupled to the edge 114 via the shelf 142 and provides a perimeter support area located around the outside of the aperture 120, such as surrounding the top of the aperture 120, and coupled to the first side 111 of the substrate 110. The shelf 142 can also provide support for the diaphragm 130. According to a possible implementation, the shelf 142 is part of the support structure 140 and provides support the diaphragm 130 so that a size of corresponding perimeter support area of the substrate 110 by the edge 114 can be radially reduced. For example, a circumference of the diaphragm 130 area could be larger, while a support area around the diaphragm 130 provided by the substrate 110 around the edge 114 could be correspondingly smaller.

Referring to FIG. 2C, according to an embodiment, depending on the thickness or other size of the diaphragm 130 and other elements, the width, W, of the support structure 140 may be from 2-75 um. For example, according to this embodiment, the diaphragm thickness, DT, can be from 1.4-1.8 um. Other sizes may also be used. For example, different sizes can be used depending on changes in size of other elements of the MEMS device 100. According to another embodiment, the thickness, ST, of the support structure 140 can be from 10-70 um depending on the size of the diaphragm 130 and other elements. The shape may also vary due to the etching process or for other design reasons.

Figure 3A:
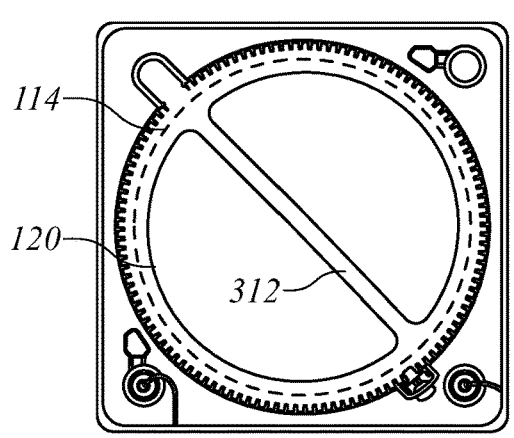
FIGS. 3A-3G are top plan views of support structures according to possible embodiments.
Figure 3B:
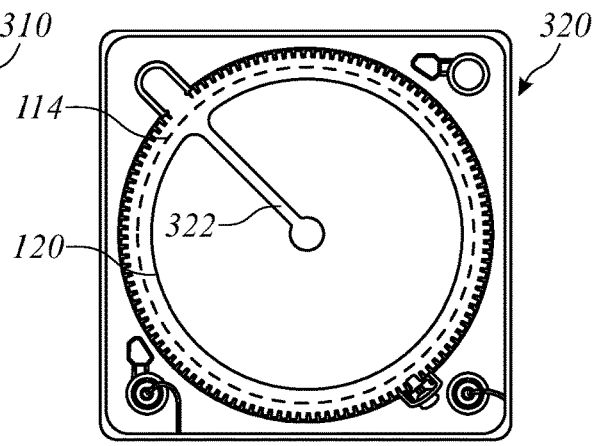
Figure 3C:
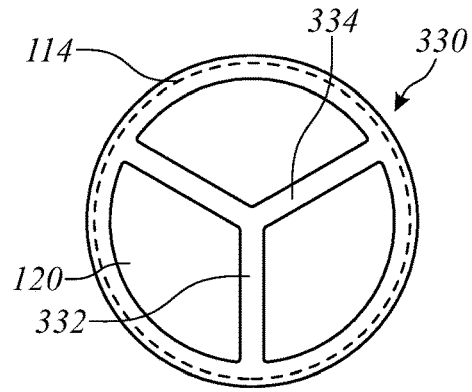
Figure 3D:
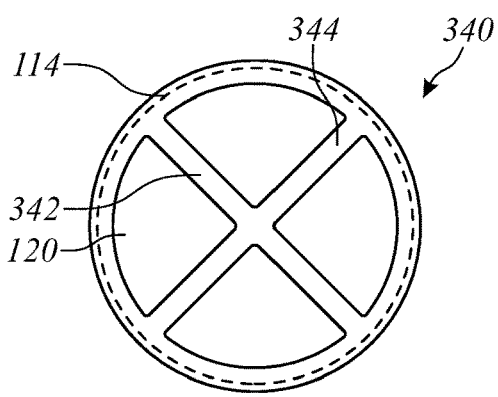

FIGS. 3A-G are top plan views 310, 320, 330, 340, 350, 360, and 370 of support structures, in relation to the edge 114, according to possible embodiments. In FIGS. 3A and 3D, the support structures 312, 342, and 344 extend fully across the aperture 120 from a first portion of the edge 114 to a second portion of the edge 114 on an opposite side of the aperture 120 from the first portion of the edge 114. In FIG. 3B, the support structure 322 extends only partially across the aperture 120.

Figure 3E:
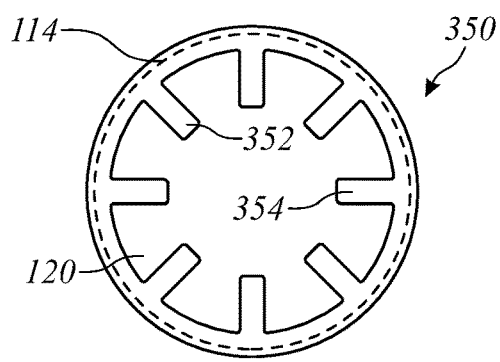
Figure 3F:
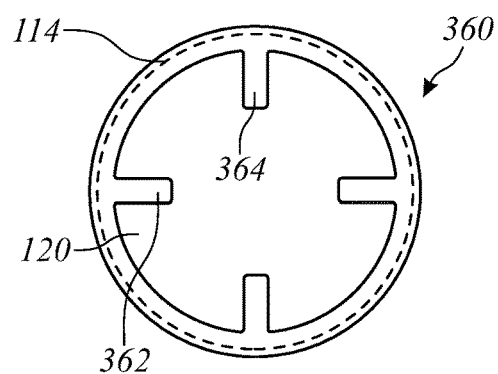

As shown in FIGS. 3C-3F, the support structure can include a first beam, labeled 332 in FIG. 3C, 342 in FIG. 3D, 352 in FIG. 3E, and 362 in FIG. 3F, that extends at least partially across the aperture 120 from the edge 114. The support structure can include a second beam, labeled 334 in FIG. 3C, 344 in FIG. 3D, 354 in FIG. 3E, and 364 in FIG. 3F, that extends at least partially across the aperture 120 from the edge 114. For example, there can be two or more support beams, such as the support beams 342 and 344, as shown in FIG. 3D, that extend across the aperture 120 and have ends that are 90 degrees apart from each other around the aperture 120, support beams 332, 334, and 336, as shown in FIG. 3C, that are 120 degrees apart from each other around the aperture 120, and/or any other number of support beams any other distance from each other. The support beams can meet in the middle of the aperture 120 as shown in FIGS. 3C and 3D or can extend only partway from the edge 114, as shown in FIGS. 3E and 3F.

Figure 3G:
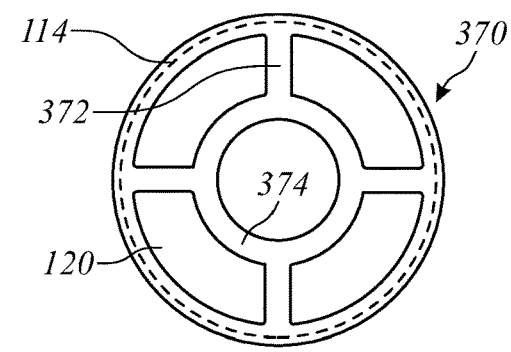

Referring to FIG. 3G, the support structure 370 can include one or more beams 372 that extend from the edge 114. The support structure 370 can also include a central structure 374 that provides additional support. The central structure 374 may be circular or may be any other shape.

Figure 4:
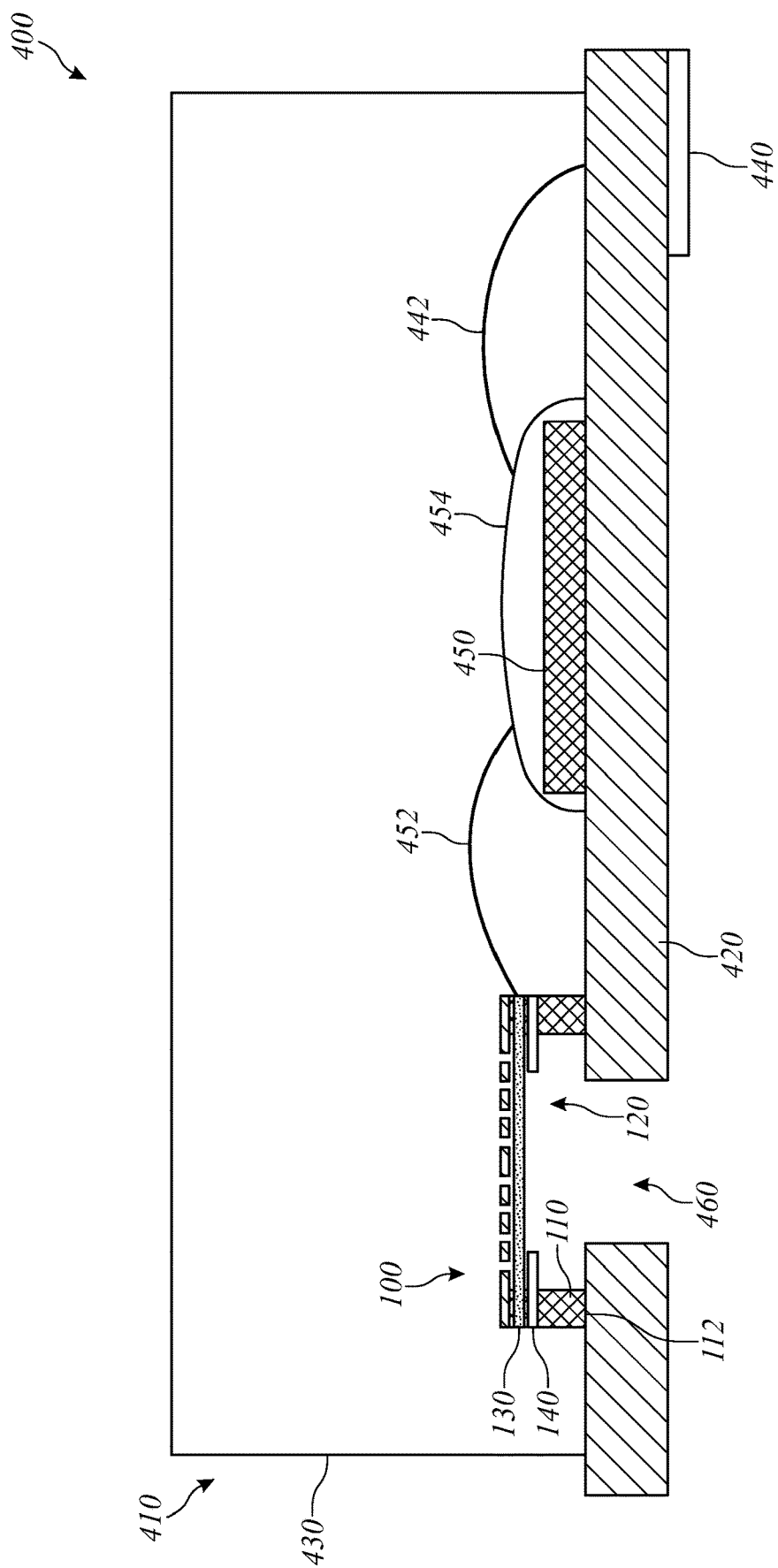
FIG. 4 is an example cross-section view of a sensor package according to an embodiment.

FIG. 4 is a cross-section view of a sensor package 400 according to an embodiment. The MEMS device 100 or any other disclosed MEMS device can be part of the sensor package 400. The sensor package 400 includes an enclosure 410 that includes a base 420 and a cover 430, such as a can or any other cover, coupled to the base 412. The MEMS device 100 is located within the enclosure 410. The sensor package 400 also includes an external-device interface 440 disposed on the base 420. The external-device interface 440 can be implemented as a surface-mount interface, can include leads configured for through-hole mounting on a host device, or can be any other interface.

The sensor package 400 further includes an integrated circuit 450, such as an Application Specific Integrated Circuit (ASIC) electrically coupled to the MEMS device 100. The integrated circuit 450 can also be coupled to contacts of the external-device interface 440, such as via an electrical lead 442 and/or leads running through the base 420. The integrated circuit 450 receives an electrical signal from the MEMS device 100, such as via an electrical lead 452, and communicates, such as via the electrical lead 442 and/or leads in the base 420, with a host device by using the contacts of the external device interface 440. According to a possible implementation, the integrated circuit 450 is covered by a protective coating 454.

According to an embodiment, the base 420 includes a sound port 460. The MEMS device 100 is acoustically coupled to the sound port 460. For example, the sound port 460 can be an aperture in the base 420 that allows sound to pass through the base to the MEMS device 100. This embodiment can be considered a bottom port embodiment, but the sound port 460 can be located at other locations on the sensor package 400. For example, the sound port 460 can also be on the cover 430 for a top-port transducer assembly. The sound port 460 can further be on a side of the sensor package 400, can be anywhere else on the sensor package 400, or there can be no sound port, such as for a MEMS die vibration sensor, vibrator, or other device. According to an embodiment, the diaphragm 140 is acoustically coupled to the sound port 460 via the aperture 120. According to other embodiments, the MEMS device 100 is used as a speaker, an actuator, a vibrator, or other MEMS device.

According to an embodiment, the sensor package 400 the base 420 is coupled to the second side 112 of the substrate 110.

According to an embodiment, a microphone assembly can include a base. The microphone assembly can include a cover disposed on the base. The cover and base can define an enclosure. The microphone assembly can include an acoustic transducer disposed on the base within the enclosure. The acoustic transducer can generate an electrical signal responsive to acoustic activity. The acoustic transducer can include a substrate including a first side and a second side on an opposite side of the substrate from the first side. The acoustic transducer can include an aperture running through the substrate from the first side to the second side. The substrate can have an edge surrounding the aperture on the first side. The acoustic transducer can include a diaphragm located over the aperture on the first side. The acoustic transducer can include a support structure that extends at least partially across the aperture from the edge.

According to a possible implementation, the support structure can extend from the edge at least partially across the aperture in a direction parallel to the first side toward a center of the aperture. According to a possible implementation, the support structure can be located between the diaphragm and the aperture. According to a possible implementation, the microphone assembly can include a back plate located on an opposite side of the diaphragm from the support structure. According to a possible implementation, the support structure can extend fully across the aperture from a first portion of the edge to a second portion of the edge on an opposite side of the aperture from the first portion. According to a possible implementation, the support structure can include a first beam that extends at least partially across the aperture from the edge. The support structure can also include a second beam that extends at least partially across the aperture from the edge. According to a possible implementation, the microphone assembly can include a shelf that extends along the edge. The support structure can extend from the shelf.

According to a possible implementation, the microphone assembly can include an external-device interface disposed on the base. The microphone assembly can include an integrated circuit electrically coupled to the diaphragm and to contacts of the external-device interface. The integrated circuit can communicate with a host device via the contacts of the external-device interface.

While this disclosure has been described with specific embodiments thereof, it is evident that many alternatives, modifications, and variations will be apparent to those skilled in the art. For example, various components of the embodiments may be interchanged, added, or substituted in the other embodiments. Also, all of the elements of each figure are not necessary for operation of the disclosed embodiments. For example, one of ordinary skill in the art of the disclosed embodiments would be enabled to make and use the teachings of the disclosure by simply employing the elements of the independent claims. Accordingly, embodiments of the disclosure as set forth herein are intended to be illustrative, not limiting. Various changes may be made without departing from the spirit and scope of the disclosure.

In this document, relational terms such as "first," "second," and the like may be used solely to distinguish one entity or action from another entity or action without necessarily requiring or implying any actual such relationship or order between such entities or actions. The phrase "at least one of," "at least one selected from the group of," or "at least one selected from" followed by a list is defined to mean one, some, or all, but not necessarily all of, the elements in the list. The terms "comprises," "comprising," "including," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a," "an," or the like does not, without more constraints, preclude the existence of additional identical elements in the process, method, article, or apparatus that comprises the element. Also, the term "another" is defined as at least a second or more. The terms "including," "having," and the like, as used herein, are defined as "comprising." Furthermore, the background section is not admitted as prior art, is written as the inventor's own understanding of the context of some embodiments at the time of filing, and includes the inventor's own recognition of any problems with existing technologies and/or problems experienced in the inventor's own work.

We claim:

1. A microelectromechanical systems (MEMS) device comprising:
    a substrate including a first side and a second side on an opposite side of the substrate from the first side;
    an aperture running through the substrate from the first side to the second side;
    a diaphragm located over the aperture on the first side; and
    a support structure that extends from the substrate at least partially across the aperture,
    wherein the substrate has an aperture edge surrounding the aperture on the first side, where the support structure further comprises an edge shelf that overlaps and extends along and from a perimeter of the aperture edge in a direction towards a central axis of the aperture, where a portion of the support structure extends from the edge shelf, and where a perimeter of the diaphragm extends over the edge shelf.

2. The MEMS device according to claim 1, wherein the support structure extends from the substrate at least partially across the aperture in a direction parallel to the first side toward a center of the aperture.

3. The MEMS device according to claim 1, wherein the support structure is located between the diaphragm and the aperture.

4. The MEMS device according to claim 1, further comprising a back plate located on an opposite side of the diaphragm from the support structure.

5. The MEMS device according to claim 1, wherein the substrate has an edge surrounding the aperture on the first side and wherein the support structure extends fully across and over a central axis of the aperture from a first portion of the edge to a second portion of the edge on an opposite side of the aperture from the first portion.

6. The MEMS device according to claim 1,
    wherein the support structure comprises a first beam that extends at least partially across the aperture from the substrate, and
    wherein the MEMS device further comprises a second beam that extends at least partially across the aperture from the substrate.

7. The MEMS device according to claim 1, further comprising:
    a base coupled to the second side, the base including an acoustic port acoustically coupled to the aperture; and
    a cover coupled to the base, the cover and the base defining an enclosure in which the substrate, diaphragm, and support structure are disposed.

8. The MEMS device according to claim 7, further comprising:
    an external-device interface disposed on the base; and
    an integrated circuit electrically coupled to the diaphragm and to contacts of the external-device interface, where the integrated circuit communicates with a host device via the contacts of the external-device interface.

9. The MEMS device according to claim 1, wherein movement of the diaphragm causes contact between the diaphragm and the support structure.

10. The MEMS device according to claim 1, wherein the support structure extends radially across the aperture from the substrate.

11. The MEMS device according to claim 1, wherein the support structure reduces flexing of the diaphragm in the direction of the aperture.

12. A microphone assembly, comprising:
a base;
a cover disposed on the base, where the cover and base define an enclosure; and
an acoustic transducer disposed on the base within the enclosure, the acoustic transducer configured to generate an electrical signal responsive to acoustic activity, the acoustic transducer comprising:
a substrate including a first side and a second side on an opposite side of the substrate from the first side;
an aperture running through the substrate from the first side to the second side;
a diaphragm located over the aperture on the first side; and
a support structure that extends at least partially across the aperture from the substrate,
wherein the substrate has an aperture edge surrounding the aperture on the first side, where the support structure further comprises an edge shelf that overlaps and extends along and from a perimeter of the aperture edge in a direction towards a central axis of the aperture, where a portion of the support structure extends from the edge shelf, and where a perimeter of the diaphragm extends over the edge shelf.

13. The microphone assembly according to claim 12, wherein the support structure extends from the substrate at least partially across the aperture in a direction parallel to the first side toward a center of the aperture.

14. The microphone assembly according to claim 12, wherein the support structure is located between the diaphragm and the aperture.

15. The microphone assembly according to claim 12, further comprising a back plate located on an opposite side of the diaphragm from the support structure.

16. The microphone assembly according to claim 12, wherein the substrate has an edge surrounding the aperture on the first side, and wherein the support structure extends fully across and over a central axis of the aperture from a first portion of the edge to a second portion of the edge on an opposite side of the aperture from the first portion.

17. The microphone assembly according to claim 12, wherein the support structure comprises:
a first beam that extends at least partially across the aperture from the substrate; and
a second beam that extends at least partially across the aperture from the substrate.

18. The microphone assembly according to claim 12, further comprising:
an external-device interface disposed on the base; and
an integrated circuit electrically coupled to the diaphragm and to contacts of the external-device interface, where the integrated circuit communicates with a host device via the contacts of the external-device interface.

19. The MEMS device according to claim 1, wherein the edge shelf provides a perimeter support area located around the edge, where the perimeter support area supports a perimeter of the diaphragm.

20. The MEMS device according to claim 1, wherein the diaphragm is circular and an entire periphery of the diaphragm overlaps the aperture edge.

\* \* \* \* \*